United States Patent
Fang et al.

(10) Patent No.: US 10,692,882 B2
(45) Date of Patent: Jun. 23, 2020

(54) METHODS FOR SOLVING EPITAXIAL GROWTH LOADING EFFECT AT DIFFERENT PATTERN DENSITY REGIONS

(71) Applicant: Yangtze Memory Technologies Co., Ltd., Wuhan, Hubei (CN)

(72) Inventors: Zhen Fang, Hubei (CN); Haihui Huang, Hubei (CN); Er Jiang Xu, Hubei (CN); Meng Wang, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,824

(22) Filed: Jul. 26, 2018

(65) Prior Publication Data
US 2019/0355739 A1    Nov. 21, 2019

Related U.S. Application Data

(63) Continuation of application No. PCT/CN2018/087144, filed on May 16, 2018.

(51) Int. Cl.
*H01L 27/11582* (2017.01)
*H01L 21/02* (2006.01)
(Continued)

(52) U.S. Cl.
CPC .... *H01L 27/11582* (2013.01); *H01L 21/0228* (2013.01); *H01L 21/0273* (2013.01);
(Continued)

(58) Field of Classification Search
CPC ......... H01L 27/11582; H01L 21/02636; H01L 21/0228; H01L 27/11556
See application file for complete search history.

(56) References Cited

U.S. PATENT DOCUMENTS 9,112,055 B2   8/2015   Hyun et al.
9,805,805 B1   10/2017  Zhang et al.
(Continued)

FOREIGN PATENT DOCUMENTS

CN    1770428 A      5/2006
CN    101582390 A    11/2009
(Continued)

OTHER PUBLICATIONS

Office Action for Chinese Application No. 201880000772.1, Chinese Patent Office, dated Jul. 8, 2019, 21 pages.
(Continued)

*Primary Examiner* — Julia Slutsker
(74) *Attorney, Agent, or Firm* — Sterne, Kessler, Goldstein & Fox P.L.L.C.

(57) ABSTRACT

The present disclosure describes methods and patterned devices for reducing a loading effect between a low pattern density region and a high pattern density region. The patterned device includes a substrate, a first insulating layer over the substrate, a low pattern density region, a high pattern density region, a second insulating layer, and an epitaxial grown layer. The low pattern density region includes a first trench in the first insulating layer and the substrate. The high pattern density region includes a second trench in the first insulating layer and the substrate. The second insulating layer is formed in the first trench. The epitaxial grown layer is formed in the second trench. The first trench has a larger cross-sectional area than the second trench.

7 Claims, 8 Drawing Sheets

(51) Int. Cl.
  *H01L 21/027* (2006.01)
  *H01L 21/033* (2006.01)
  *H01L 21/3105* (2006.01)
  *H01L 21/311* (2006.01)
  *H01L 27/11556* (2017.01)

(52) U.S. Cl.
  CPC .. *H01L 21/02164* (2013.01); *H01L 21/02532* (2013.01); *H01L 21/02636* (2013.01); *H01L 21/0332* (2013.01); *H01L 21/0337* (2013.01); *H01L 21/31053* (2013.01); *H01L 21/31111* (2013.01); *H01L 21/31116* (2013.01); *H01L 21/31144* (2013.01); *H01L 27/11556* (2013.01)

(56) References Cited

U.S. PATENT DOCUMENTS

| | | |
|---|---|---|
| 2001/0015046 A1 | 8/2001 | Hong |
| 2013/0105861 A1 | 5/2013 | Liao et al. |
| 2016/0141205 A1 | 5/2016 | Chiang et al. |
| 2017/0069754 A1* | 3/2017 | Iinuma ................ H01L 29/7843 |
| 2017/0125538 A1* | 5/2017 | Sharangpani ....... H01L 27/1157 |
| 2017/0287926 A1* | 10/2017 | Ariyoshi ........... H01L 27/11565 |
| 2019/0067025 A1* | 2/2019 | Yada ........................ G11C 8/14 |

FOREIGN PATENT DOCUMENTS

| | | |
|---|---|---|
| CN | 103887342 A | 6/2014 |
| CN | 104282615 | 1/2015 |
| CN | 105874587 A | 8/2016 |
| KR | 0147277 B1 | 11/1998 |
| KR | 20070047179 A | 5/2007 |

OTHER PUBLICATIONS

Office Action for Chinese Application No. 201880000772.1, Chinese Patent Office, dated May 14, 2019, 14 pages.
International Search Report and Written Opinion for International Application No. PCT/CN2018/087144, Chinese Patent Office, Beijing, dated Feb. 13, 2019, 8 pages.

* cited by examiner

METHODS FOR SOLVING EPITAXIAL GROWTH LOADING EFFECT AT DIFFERENT PATTERN DENSITY REGIONS

CROSS-REFERENCES TO RELATED APPLICATIONS

This application claims the priority of PCT Patent Application No. PCT/CN2018/087144 filed on May 16, 2018, the entire content of which is incorporated herein by reference.

BACKGROUND

In the semiconductor industry, epitaxy is the growth of a crystalline layer, typically from a seed layer in a seed window area. A seed window area refers to the two-dimensional size of an exposed surface where an epitaxial layer is to be grown. With the scaling down of device dimensions, such as for three-dimensional (3D) NAND flash memory devices, the seed window area is also reduced. Seed window area dimensions and surface deformations can greatly affect the epitaxial growth rate of an epitaxial layer in the seed window area, which has been described as a loading effect.

The loading effect, which is also referred to as a local loading effect or a pattern loading effect, occurs due to a difference in pattern density. The phenomenon occurs upon simultaneous epitaxial growth in a low pattern density region (i.e., larger seed window area) and in a high pattern density region (i.e., smaller seed window area). Depending on the local pattern density, the epitaxial growth rate is different and causes a non-uniformity in the thickness of the grown epitaxial layer. The non-uniformity in epitaxial layer thickness between low and high pattern density regions makes device processing difficult to control and may adversely affect device performance.

BRIEF SUMMARY

Embodiments of patterned devices and fabrication methods thereof are disclosed herein.

In some embodiments, a patterned device includes a substrate, a first insulating layer over the substrate, a low pattern density region, a high pattern density region, a second insulating layer, and an epitaxial grown layer. A low pattern density region includes a first trench in the first insulating layer and the substrate. A high pattern density region includes a second trench in the first insulating layer and the substrate. The second insulating layer is formed in the first trench. The epitaxial grown layer is formed in the second trench. The first trench has a larger cross-sectional area than the second trench.

In some embodiments, the first insulating layer can include alternating silicon oxide and silicon nitride layers. The patterned device includes a three-dimensional NAND memory device. The second insulating layer can be silicon oxide.

In some embodiments, the second insulating layer is atomic layer deposited silicon oxide. The second insulating layer completely fills the first trench of the low pattern density region. The second insulating layer fills the first trench and the second trench remains open to the substrate, in order to reduce an epitaxial growth loading effect between the low pattern density region and the high pattern density region.

In some embodiments, a method for reducing an epitaxial growth loading effect in a patterned device includes forming a first trench and a second trench in a substrate and in a first insulating layer over the substrate to form a low pattern density region and a high pattern density region. The first trench has a larger cross-sectional area than the second trench. The method includes isolating the first trench from the second trench by using a first mask. The method includes disposing a second insulating layer in the first trench. The method includes removing a portion of the first mask in order to expose the second trench. The method includes growing an epitaxial layer in the second trench.

In some embodiments, forming the first and second trenches includes etching using an anisotropic reactive ion etch. Isolating includes depositing a first dielectric layer and depositing a second dielectric layer to form the first mask. Isolating includes patterning a second mask above the low pattern density region in order to expose the first mask. Patterning the second mask includes forming a photoresist layer above the first mask, exposing the photoresist layer to absorptive light, and developing the photoresist layer. Disposing the second insulating layer in the first trench includes depositing using atomic layer deposition.

In some embodiments, the method includes planarizing the second insulating layer and the first mask. The method includes planarizing the second insulating layer and the first dielectric layer. Removing the first mask includes etching using a wet chemical etch. Growing the epitaxial layer includes growing a silicon epitaxial layer.

In some embodiments, a method for fabricating a patterned device includes forming a first trench and a second trench in a substrate and in a first insulating layer over the substrate to form a low pattern density region and a high pattern density region. The first trench has a larger cross-sectional area than the second trench. The method includes depositing a first mask above the first insulating layer covering the first trench and the second trench. The method includes patterning a second mask above the low pattern density region in order to expose the first mask. The method includes removing at least a portion of the first mask in order to expose the first trench. The method includes disposing a second insulating layer in the first trench. The method includes removing a further portion of the first mask in order to expose the second trench. The method includes growing an epitaxial layer in the second trench.

In some embodiments, disposing the first mask includes depositing a first dielectric layer and depositing a second dielectric layer. Patterning the second mask includes forming a photoresist layer above the first mask, exposing the photoresist layer to absorptive light, and developing the photoresist layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
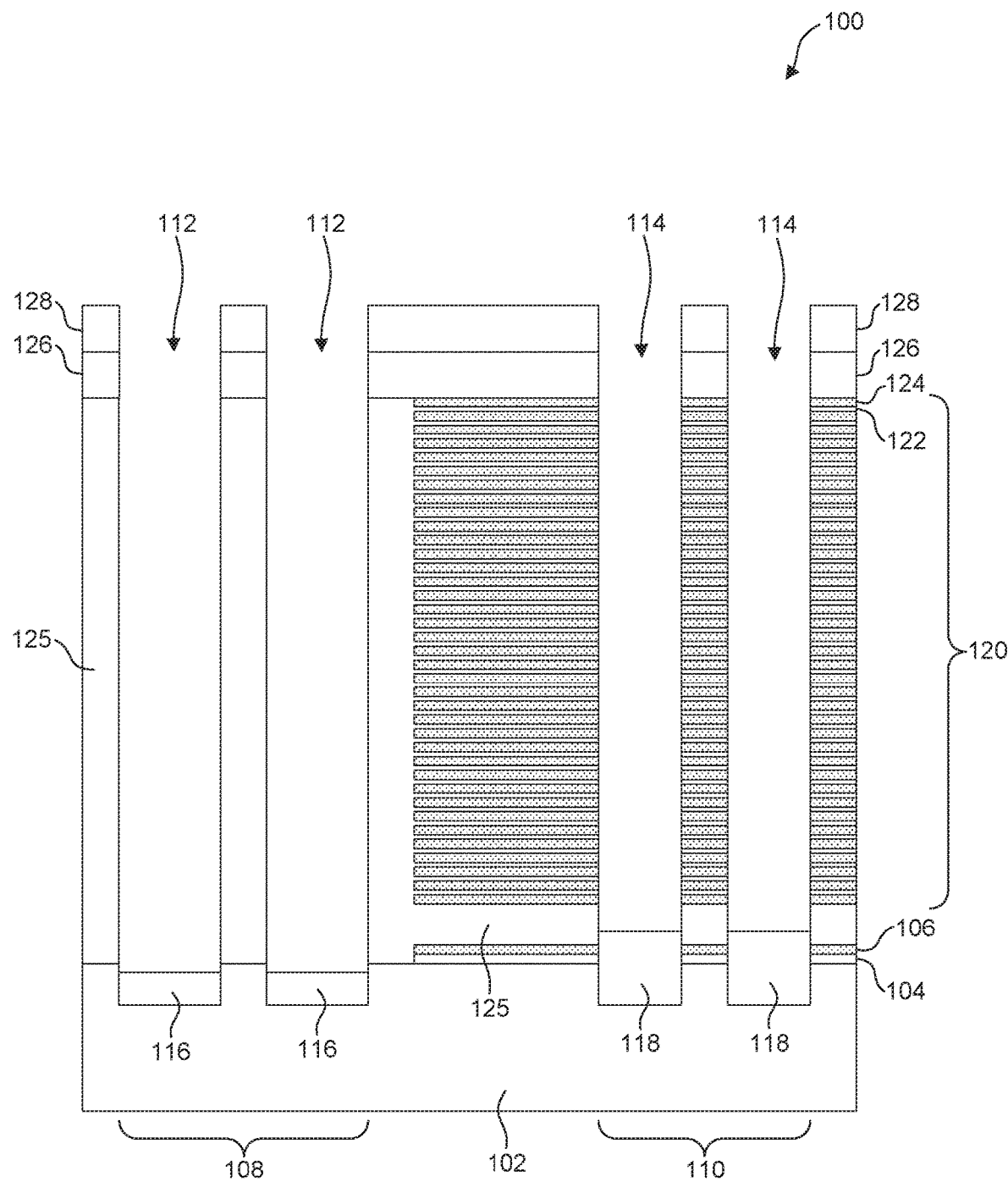
FIG. 1 illustrates a cross-section of a patterned device with an epitaxial growth loading effect, according to some embodiments.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "patterned device" refers to a semiconductor device with vertically oriented layers on a laterally oriented substrate so that the layers extend in the vertical direction with respect to the substrate. As used herein, the term "vertical/vertically" means nominally perpendicular to the lateral surface of a substrate. As used herein, the term "disposing" refers to depositing, coating, curing, solidification, spinning-on, and/or any other suitable technique as known in the art.

Epitaxy is the growth of a crystalline layer, typically from a seed layer. Epitaxy includes homoepitaxy (i.e., one material), heteroepitaxy (i.e., two or more different materials), heterotopotaxy (i.e., form of 3D growth), pendeo-epitaxy (i.e., form of 3D), or other equivalent forms. The substrate of a patterned device can act as a seed layer. With the scaling down of device dimensions, such as for 3D NAND flash memory devices, the seed window area is also reduced. Seed window area refers to the two-dimensional size of an exposed surface where an epitaxial layer is to be grown. When seed window area dimensions are similar in magnitude to the diffusion length of growth component adatoms (i.e., atom on a crystal surface), the impact of the seed window area on epitaxial growth rate is significant. Reduced seed window area dimensions as well as increased surface roughness from etching processes can greatly affect the epitaxial growth rate of an epitaxial layer in the seed window area. These factors can cause an epitaxial growth loading effect between different pattern densities for simultaneous epitaxial growth.

The loading effect, which has been described as a local loading effect or a pattern loading effect, occurs due to a difference in pattern density. The phenomenon occurs upon simultaneous epitaxial growth in a low pattern density region (i.e., larger seed window area) and in a high pattern density region (i.e., smaller seed window area). Depending on the local pattern density, the epitaxial growth rate is different and causes a non-uniformity in the thickness of the grown epitaxial layer. Low pattern density regions have a lower epitaxial growth rate, while high pattern density regions have a higher epitaxial growth rate. The result of the loading effect is a lower epitaxial layer thickness for low pattern density regions and a higher epitaxial layer thickness for high pattern density regions.

The surface roughness of local pattern density regions can also affect the epitaxial growth rate. For example, to form high aspect ratio trenches in a patterned device, etch processes damage the substrate interface and effects the epitaxial growth. To improve the substrate interface, a post-etch treatment can be used to clean the native oxide and substrate grains. For example, buffered oxide etch (BOE), buffered hydrofluoric acid (BHF), or plasma etch cleaning can be used to remove the native silicon oxide layer and any broken silicon grains. However, simultaneous epitaxial growth in different pattern density regions can lead to non-uniformity due to different surface roughness, even with post-etch treatments. The non-uniformity in epitaxial layer thickness and surface roughness between low and high pattern density regions makes device processing difficult to control and may adversely affect device performance. Further, epitaxial growth may not occur at certain pattern density regions, which could cause current leakage at a bottom or dummy selective gate in the patterned device.

The present disclosure describes embodiments of patterned devices and methods to reduce the epitaxial growth loading effect. The disclosed methods and structures can be incorporated into fabricated devices, for example, 3D NAND memory devices.

FIG. 1 illustrates patterned device 100, according to an exemplary embodiment. Patterned device 100 can include substrate 102, low pattern density region 108, high pattern density region 110, first trench 112, second trench 114, insulating layer 125, low density epitaxial layer 116, and high density epitaxial layer 118. Patterned device 100 demonstrates an epitaxial growth loading effect between low pattern density region 108 and high pattern density region 110, as indicated by the difference in thickness or layer height of low density epitaxial layer 116 and high density epitaxial layer 118. Low pattern density region 108 includes first trench 112. High pattern density region 110 includes second trench 114. First trench 112 has a larger cross-sectional area than second trench 114. First trench 112 and second trench 114 extend through insulating layer 125 and partially through substrate 102.

Insulating layer 125 is formed over substrate 102. Insulating layer 125 can include first bottom insulating layer 104, second bottom insulating layer 106, and/or alternating insulating layer 120. Alternating insulating layer 120 can include first patterned insulating layer 122 and second patterned insulating layer 124 in a vertically alternating stacked pattern. As shown in FIG. 1, patterned device 100 can additionally include first top insulating layer 126 and second top insulating layer 128. First top insulating layer 126 is disposed over insulating layer 125, and second top insulating layer 128 is disposed over first top insulating layer 126. Low density epitaxial layer 116 and high density epitaxial layer 118 can be formed in first trench 112 and second trench 114, respectively, by epitaxy.

In some embodiments, substrate 102 can be made of silicon. In some embodiments, substrate 102 includes any suitable material for forming patterned device 100 with high density epitaxial layer 118. For example, substrate 102 can include silicon, silicon germanium, silicon carbide, silicon on insulator (SOI), germanium on insulator (GOI), glass, gallium nitride, gallium arsenide, and/or other suitable III-V compound.

In some embodiments, insulating layer 125 can be made of silicon oxide. In some embodiments, insulating layer 125 can be any suitable dielectric material including silicon oxide, silicon nitride, silicon oxynitride, organosilicate glass, spin-on-glass (SOG), and/or any other suitable dielectric materials. In some embodiments, insulating layer 125 can be formed or deposited by any suitable methods including chemical vapor deposition (CVD), physical vapor deposition (PVD), plasma-enhanced CVD (PECVD), low pressure CVD (LPCVD), sputtering, metal-organic CVD (MOCVD), atomic layer deposition (ALD), pulsed laser deposition (PLD), liquid source misted chemical deposition, and/or other suitable deposition methods.

In some embodiments, first patterned insulating layer 122 can be made of silicon oxide and second patterned insulating layer 124 can be made of silicon nitride. In some embodiments, second patterned insulating layer 124 can include any suitable material different from first patterned insulating layer 122. For example, second patterned insulating layer 124 can include poly-crystalline silicon, silicon nitride, poly-crystalline germanium, and/or poly-crystalline germanium-silicon. In some embodiments, second patterned insulating layer 124 can include silicon nitride. In some embodiments, first patterned insulating layer 122 can include any suitable insulating materials, for example, silicon oxide.

In some embodiments, alternating insulating layer 120 includes an alternating stack of first patterned insulating layer 122 (i.e., first element or first material) and second patterned insulating layer 124 (i.e., second element or second material), arranged vertically (along z-axis) over substrate 102. In some embodiments, first patterned insulating layer 122 and corresponding underlying second patterned insulating layer 124 are referred to as an element pair or material pair. In some embodiments, second patterned insulating layer 124 is a sacrificial layer, to be removed subsequently for disposing gate metal material for forming patterned structures, for example, wordlines. In some embodiments, alternating insulating layer 120 can be formed by alternatingly disposing first patterned insulating layer 122 and second patterned insulating layer 124 over substrate 102. For example, first patterned insulating layer 122 can be disposed over substrate 102 or insulating layer 125, and second patterned insulating layer 124 can be disposed on first patterned insulating layer 122, and so on and so forth. In some embodiments, alternating insulating layer 120 can be formed or deposited by any suitable methods including CVD, PVD, PECVD, LPCVD, sputtering, MOCVD, ALD, PLD, liquid source misted chemical deposition, and/or other suitable deposition methods.

In some embodiments, low pattern density region 108 can include a plurality of first trenches 112. In some embodiments, high pattern density region 110 can include a plurality of second trenches 114. In some embodiments, first trench 112 and second trench 114 can be formed by etching. For example, first trench 112 and second trench 114 can be formed by anisotropic reactive ion etching (ME). In some embodiments, the etching of insulating layer 125, alternating insulating layer 120, first bottom insulating layer 104, second bottom insulating layer 106, first top insulating layer 126, and/or second top insulating layer 128 can be performed in one etching process or different etching processes. For example, the etching processes can be plasma processes, for example, RIE using oxygen-based plasma. In some embodiments, ME process can include etchant gas, for example, carbon tetrafluoride ($CF_4$), sulfur hexafluoride ($SF_6$), fluoroform ($CHF_3$), and/or other suitable gases. Numerous other etching methods can also be suitable. In some embodiments, first trench 112 and second trench 114 can be formed by using a mask, for example, a photoresist mask that can be patterned, and etching portions insulating layer 125, alternating insulating layer 120, first bottom insulating layer 104, second bottom insulating layer 106, first top insulating layer 126, and/or second top insulating layer 128 exposed by the patterned mask using a suitable etching process, e.g., dry etch and/or wet etch. In some embodiments, first trench 112 and second trench 114 can be through insulating layer 125, alternating insulating layer 120, first bottom insulating layer 104, second bottom insulating layer 106, first top insulating layer 126, and/or second top insulating layer 128 and substantially into substrate 102. The mask can be removed after first trench 112 and second trench 114 are formed.

In some embodiments, low density epitaxial layer 116 and/or high density epitaxial layer 118 can be an epitaxial grown semiconductor layer. For example, low density epitaxial layer 116 and/or high density epitaxial layer 118 can be epitaxial silicon, silicon germanium, germanium, III-V compound material, II-VI compound material, organic semiconductor material, and/or other suitable semiconductor materials. In some embodiments, low density epitaxial layer 116 and/or high density epitaxial layer 118 can be single-crystalline.

FIGS. 2-7 illustrate embodiments of patterned devices to reduce the epitaxial growth loading effect. FIGS. 2-7 illustrate patterned device 200, 300, 400, 500, 600, 700, according to embodiments. The embodiments of patterned device 200, 300, 400, 500, 600, 700 shown in FIGS. 2-7 and the embodiments of patterned device 100 shown in FIG. 1 are similar. Similar reference numbers are used to indicate similar features of the embodiments of patterned device 200, 300, 400, 500, 600, 700 shown in FIGS. 2-7 and similar features of the embodiments of patterned device 100 shown in FIG. 1.

Figure 2:
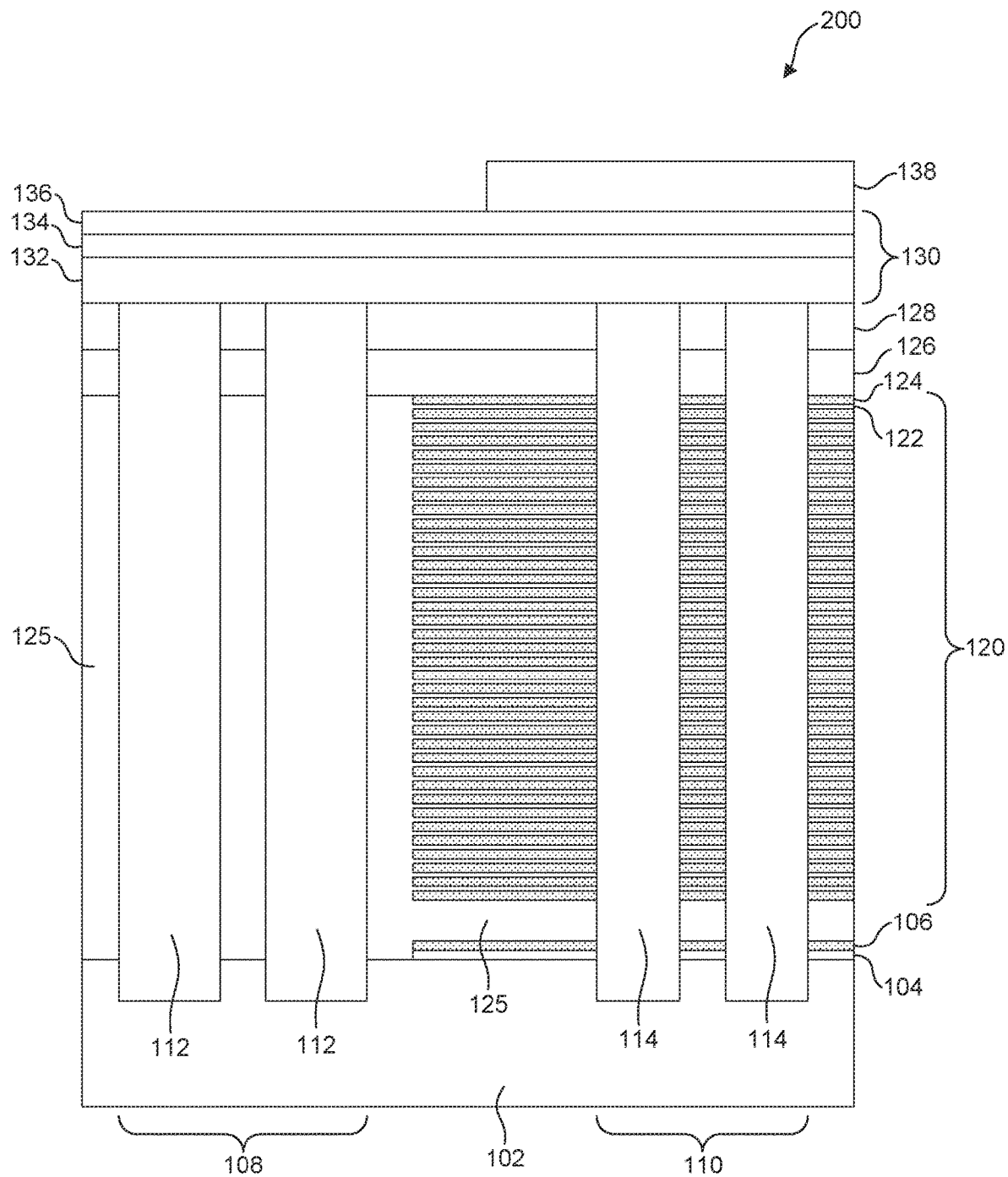
FIGS. 2-7 illustrate a cross-section of a patterned device, according to some embodiments.

The main differences between the embodiments of patterned device 200 shown in FIG. 2 and the embodiments of patterned device 100 shown in FIG. 1 are the addition of protective mask 130 and photoresist mask 138, and the omission of low density epitaxial layer 116 and high density epitaxial layer 118. The main differences between the embodiments of patterned device 300 shown in FIG. 3 and the embodiments of patterned device 100 shown in FIG. 1 are the addition of protective mask 130, and the omission of low density epitaxial layer 116 and high density epitaxial layer 118. The main differences between the embodiments of patterned device 400 shown in FIG. 4 and the embodiments of patterned device 100 shown in FIG. 1 are the addition of protective mask 130 and protective layer 140, and the omission of first trench 112, low density epitaxial layer 116, and high density epitaxial layer 118. The main differences between the embodiments of patterned device 500 shown in FIG. 5 and the embodiments of patterned device 100 shown in FIG. 1 are the addition of first dielectric layer 132 of protective mask 130, protective layer 140, and planarized surface 150, and the omission of first trench 112, low density epitaxial layer 116, and high density epitaxial layer 118. The main differences between the embodiments of patterned device 600 shown in FIG. 6 and the embodiments of patterned device 100 shown in FIG. 1 are the addition of protective layer 140 and etched top surface 160, and the omission of first trench 112, low density epitaxial layer 116, and high density epitaxial layer 118. The main differences between the embodiments of patterned device 700 shown in FIG. 7 and the embodiments of patterned device 100 shown in FIG. 1 are the addition of protective layer 140 and etched top surface 160, and the omission of first trench 112, low density epitaxial layer 116, and high density epitaxial layer 118.

Referring to FIG. 2, patterned device 200 is similar to patterned device 100 of FIG. 1. FIG. 2 illustrates patterned device 200, according to an exemplary embodiment. Patterned device 200 includes protective mask 130 and photoresist mask 138. Protective mask 130 is deposited or formed over all or some portion of insulating layer 125, first top insulating layer 126, or second top insulating layer 128. Protective mask 130 functions as a first mask for patterned device 200 and protects (i.e., covers) first trench 112 and/or second trench 114. Photoresist mask 138 is deposited or formed over all or some portion of protective mask 130, and is patterned to isolate or expose a particular region of interest (e.g., low pattern density region 108) of protective mask 130 for further processing. For example, a suitable photoresist (e.g., PMMA, SU-8, SPR3612, AZ4620, etc.) can be spun onto protective mask 130 to form a photoresist layer, which can subsequently be patterned by exposure to absorptive light (e.g., DUV, I-line, H-line, etc.) and development with an appropriate developer to form photoresist mask 138. Other photoresist techniques or procedures can be used as known in the art. Photoresist mask 138 functions as a second mask for patterned device 200 and isolates or exposes a particular region of interest (e.g., low pattern density region 108) of protective mask 130 for further processing.

In some embodiments, protective mask 130 can include one or more layers. For example, as shown in FIG. 2, protective mask 130 can include first dielectric layer 132, second dielectric layer 134, and/or third dielectric layer 136. In some embodiments, first dielectric layer 132 can be silicon oxide. In some embodiments, first dielectric layer 132 can be fast deposited or deposited rapidly so as not to coat first trench 112 and/or second trench 114. For example, first dielectric layer 132 can be deposited by rapid thermal CVD (RTCVD). In some embodiments, first dielectric layer 132, second dielectric layer 134, and/or third dielectric layer 136 can be can be any suitable dielectric material including silicon oxide, silicon nitride, silicon oxynitride, organosilicate glass, spin-on-glass (SOG), an anti-reflective coating, and/or any other suitable dielectric materials. In some embodiments, protective mask 130 can be formed or deposited by any suitable methods including CVD, PVD, PECVD, LPCVD, sputtering, MOCVD, ALD, PLD, liquid source misted chemical deposition, and/or other suitable deposition methods. In some embodiments, second dielectric layer 134 and/or third dielectric layer 136 can be omitted from protective mask 130. In some embodiments, protective mask 130 is first dielectric layer 132.

Figure 3:
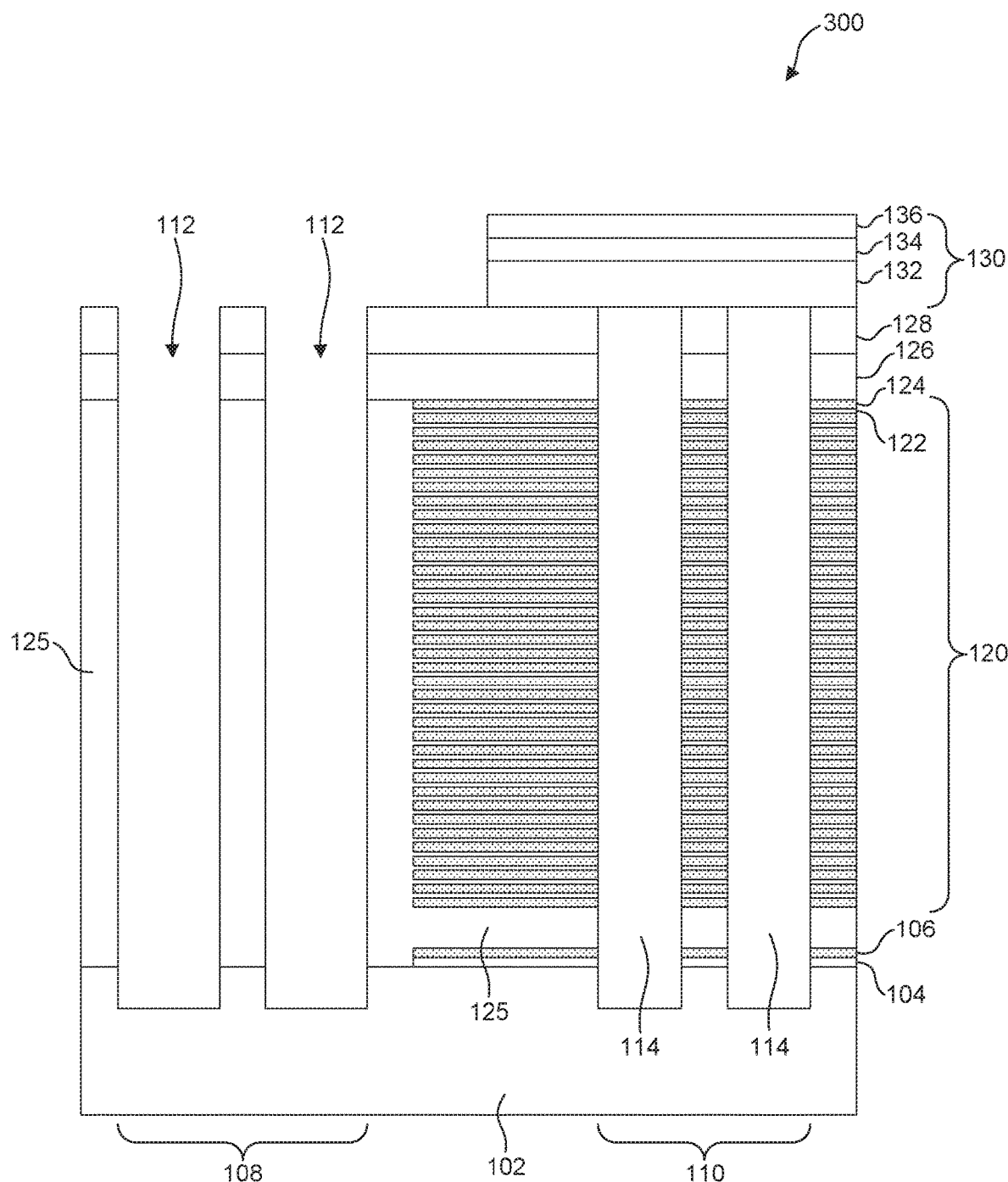

Referring to FIG. 3, patterned device 300 is similar to patterned device 100 of FIG. 1. FIG. 3 illustrates patterned device 300, according to an exemplary embodiment. Patterned device 300 includes protective mask 130 that has been etched to expose first trench 112. Etching protective mask 130 in low pattern density region 108 allows first trench 112 to be exposed while second trench 114 is protected. Photoresist mask 138 can be removed either during etching of protective mask 130 or after by, for example, ashing, plasma etching, and/or by using a photoresist stripper. In some embodiments, multiple photoresist layers and/or multiple etching processes can be employed to etch protective mask 130.

In some embodiments, protective mask 130 can be etched by anisotropic RIE. In some embodiments, the etching of protective mask 130 can be performed in one etching process or different etching processes. For example, the etching processes can be plasma processes such as, for example, RIE using oxygen-based plasma. In some embodiments, RIE process can include etchant gas such as, for example, $CF_4$, $SF_6$, $CHF_3$, and/or other suitable gases. Numerous other etching methods can also be suitable, for example, dry etch and/or wet etch processing as known in the art.

Figure 4:
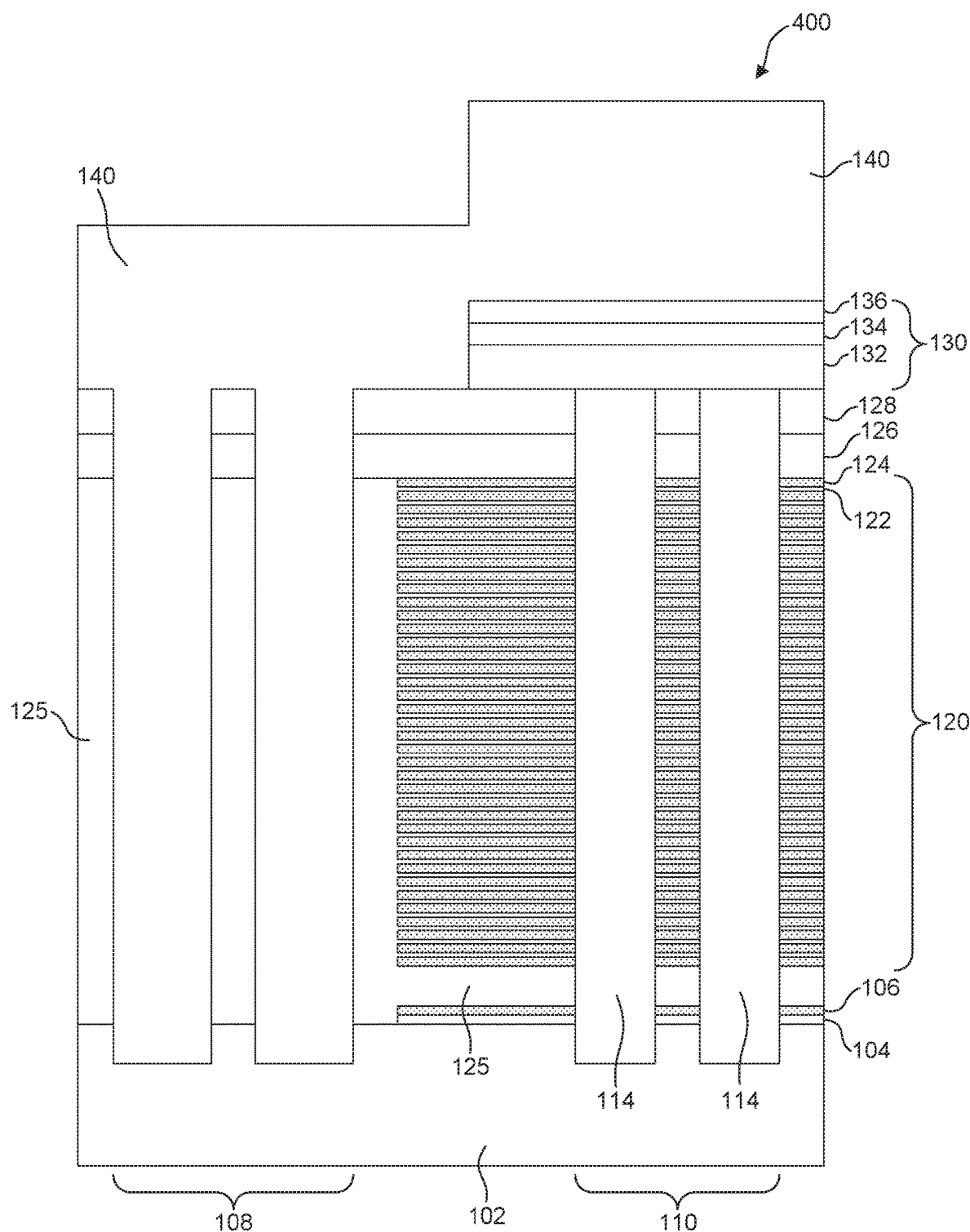

Referring to FIG. 4, patterned device 400 is similar to patterned device 100 of FIG. 1. FIG. 4 illustrates patterned device 400, according to an exemplary embodiment. Patterned device 400 includes protective layer 140. Protective layer 140 functions as a second insulating layer for first trench 112, in order to partially or completely fill first trench 112. Protective layer 140 reduces an epitaxial growth loading effect between low pattern density region 108 and high pattern density region 110. Protective layer 140 is deposited or formed over all or some portion of insulating layer 125, first top insulating layer 126, or second top insulating layer 128, and first trench 112.

In some embodiments, protective layer 140 can include one or more layers. In some embodiments, protective layer 140 can be silicon oxide. In some embodiments, first dielectric layer 132 and protective layer 140 can be the same material. In some embodiments, protective layer 140 can be any suitable dielectric material including silicon oxide, silicon nitride, silicon oxynitride, organosilicate glass, spin-on-glass (SOG), an anti-reflective coating, and/or any other suitable dielectric materials. In some embodiments, protective layer 140 can be formed or deposited by any suitable methods including CVD, PVD, PECVD, LPCVD, sputtering, MOCVD, ALD, PLD, liquid source misted chemical deposition, and/or other suitable deposition methods. In some embodiments, protective layer 140 can be deposited to completely fill first trench 112. In some embodiments, protective layer 140 can be silicon oxide deposited by ALD. In some embodiments, protective layer 140 can be deposited to a vertical thickness equal to a top surface of insulating layer 125, first top insulating layer 126, second top insulating layer 128, first dielectric layer 132, second dielectric layer 134, or third dielectric layer 136 in low pattern density region 108.

Figure 5:
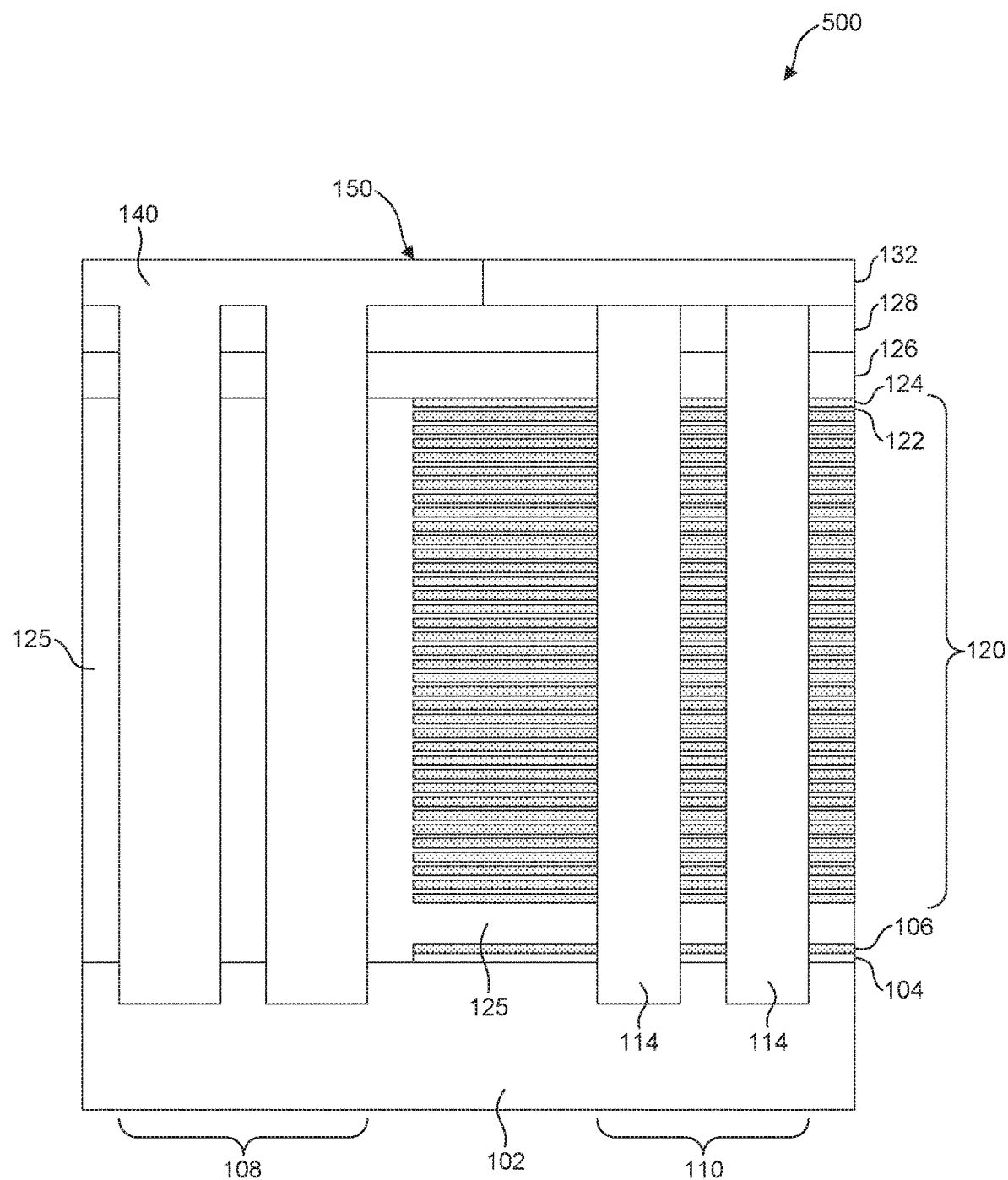

Referring to FIG. 5, patterned device 500 is similar to patterned device 100 of FIG. 1. FIG. 5 illustrates patterned device 500, according to an exemplary embodiment. Patterned device 500 includes protective layer 140 and first dielectric layer 132 with planarized surface 150. Planarized surface 150 is the result of planarizing or polishing protective layer 140 and protective mask 130, for example, by chemical mechanical planarization (CMP). For example, as shown in FIG. 5, protective mask 130 can be planarized down to first dielectric layer 132, such that a top surface of protective layer 140 and a top surface of first dielectric layer 132 have equal vertical heights.

In some embodiments, planarized surface 150 can be formed by one or more etching processes. For example, planarized surface 150 can be formed by anisotropic ME, RIE using oxygen-based plasma, RIE using an etchant gas, for example, $CF_4$, $SF_6$, $CHF_3$, and/or other suitable gases, dry etching, and/or wet etching as known in the art.

Figure 6:
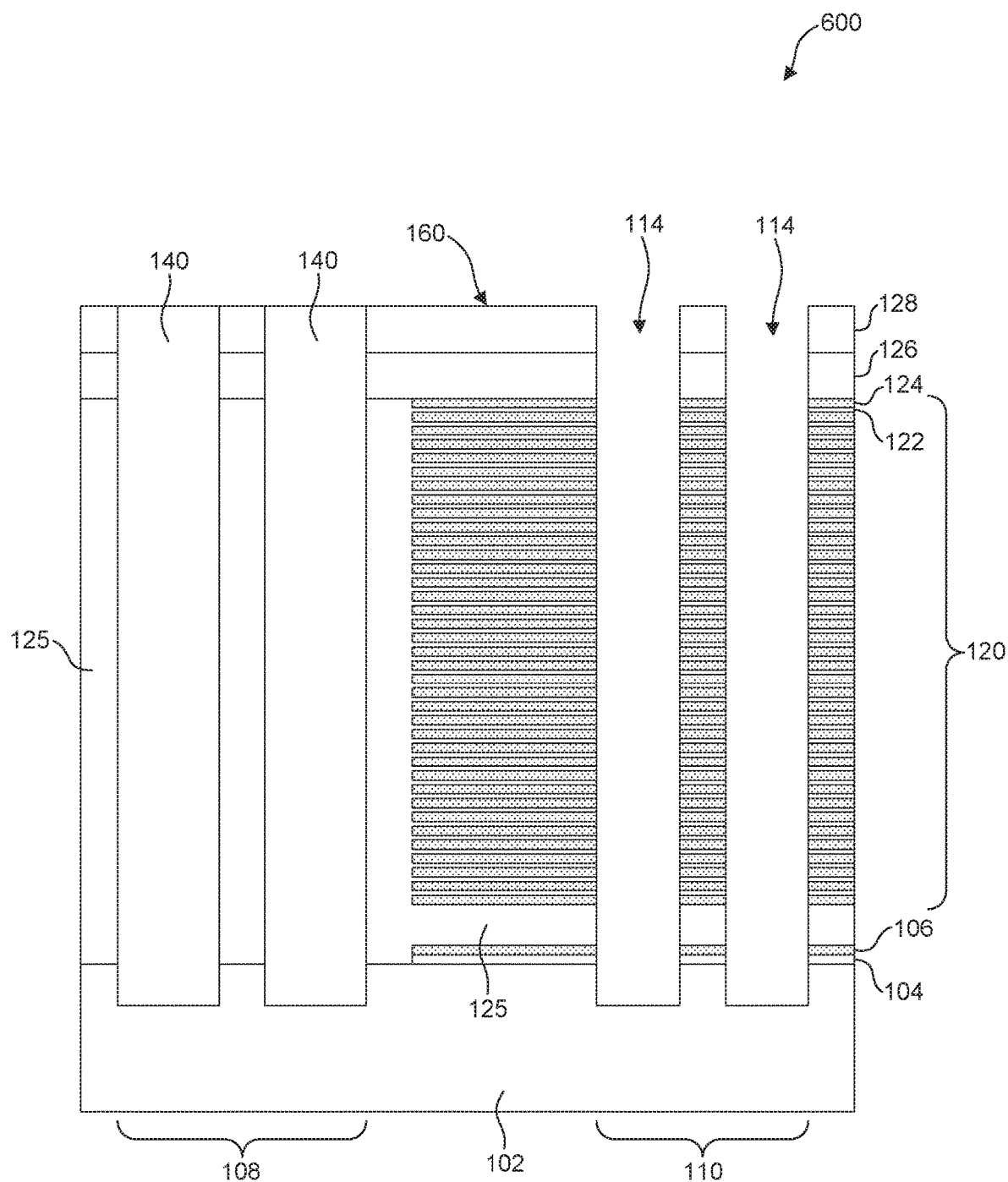

Referring to FIG. 6, patterned device 600 is similar to patterned device 100 of FIG. 1. FIG. 6 illustrates patterned device 600, according to an exemplary embodiment. Patterned device 600 includes protective layer 140 in first trench 112, exposed second trench 114, and etched top surface 160. Etched top surface 160 is the result of etching protective layer 140 and protective mask 130, for example, first dielectric layer 132. For example, as shown in FIG. 6, protective layer 140 and first dielectric layer 132 can be etched down to etched top surface 160, such that second trench 114 is exposed while first trench 112 is protected by protective layer 140.

In some embodiments, protective layer 140 and first dielectric layer 132 can be the same material. For example, protective layer 140 and first dielectric layer 132 can be silicon oxide. In some embodiments, etched top surface 160 can be formed by one or more etching processes. For example, etched top surface 160 can be formed by anisotropic RIE, RIE using oxygen-based plasma, RIE using an etchant gas, for example, $CF_4$, $SF_6$, $CHF_3$, and/or other suitable gases, dry etching, and/or wet etching as known in the art. In some embodiments, protective layer 140 and first dielectric layer 132 can be wet etched. For example, buffered oxide etch (BOE) or buffered hydrofluoric acid (BHF) can be used.

Figure 7:
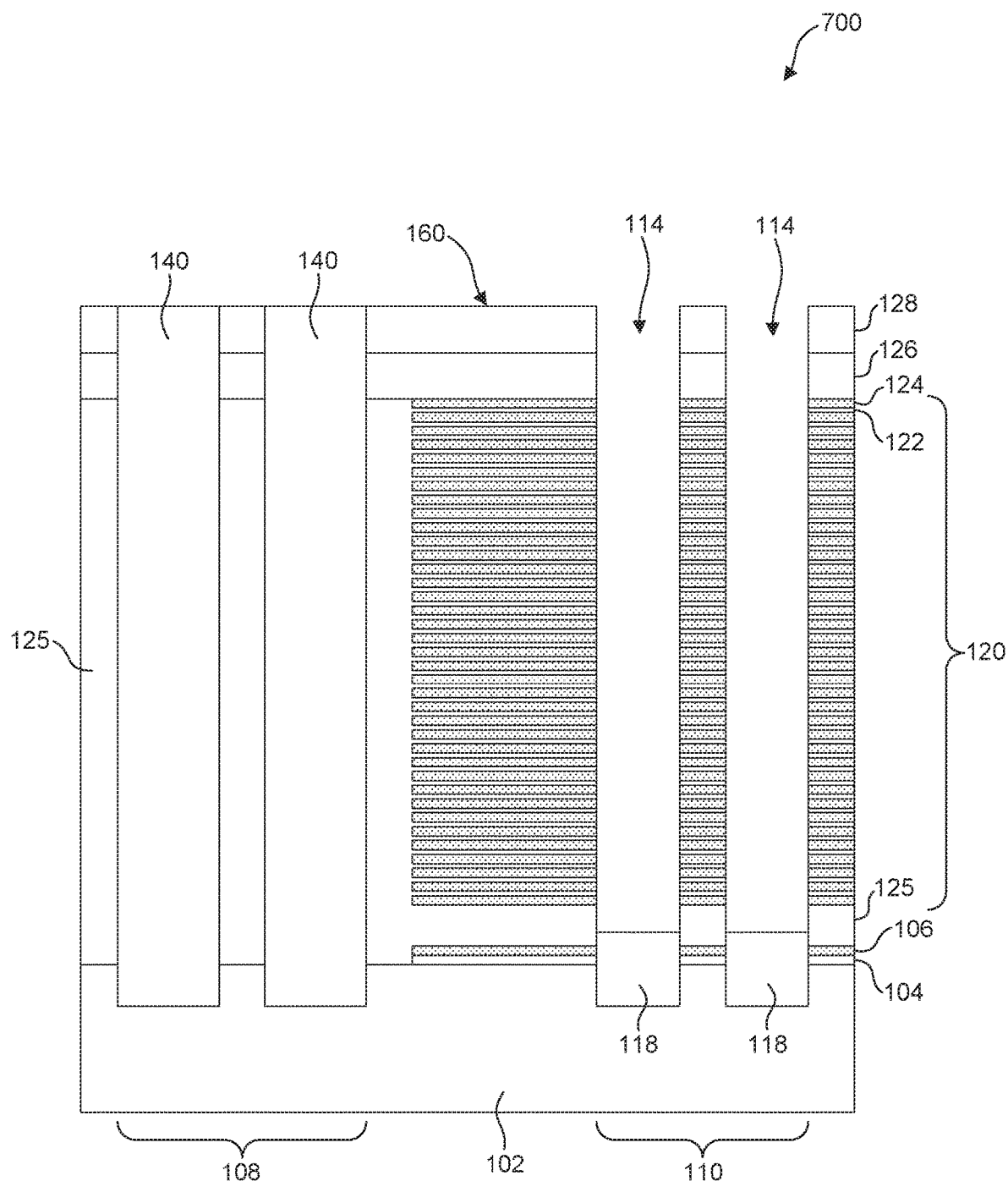

Referring to FIG. 7, patterned device 700 is similar to patterned device 100 of FIG. 1. FIG. 7 illustrates patterned device 700, according to an exemplary embodiment. Patterned device 700 includes high density epitaxial layer 118 in second trench 114 and protective layer 140 in first trench 112. High density epitaxial layer 118 is formed in second trench 114 by epitaxy. As discussed above, protective layer 140 functions as a second insulating layer for first trench 112, and reduces an epitaxial growth loading effect between low pattern density region 108 and high pattern density region 110. Further, protective layer 140 reduces current leakage in patterned device 700 by insulating first trench 112 and thereby avoids any epitaxial growth, e.g., low density epitaxial layer 116, in first trench 112.

In some embodiments, high density epitaxial layer 118 can be an epitaxial grown semiconductor layer. For example, high density epitaxial layer 118 can be epitaxial silicon, silicon germanium, germanium, III-V compound material, II-VI compound material, organic semiconductor material, and/or other suitable semiconductor materials. In some embodiments, high density epitaxial layer 118 can be single-crystalline.

Figure 8:
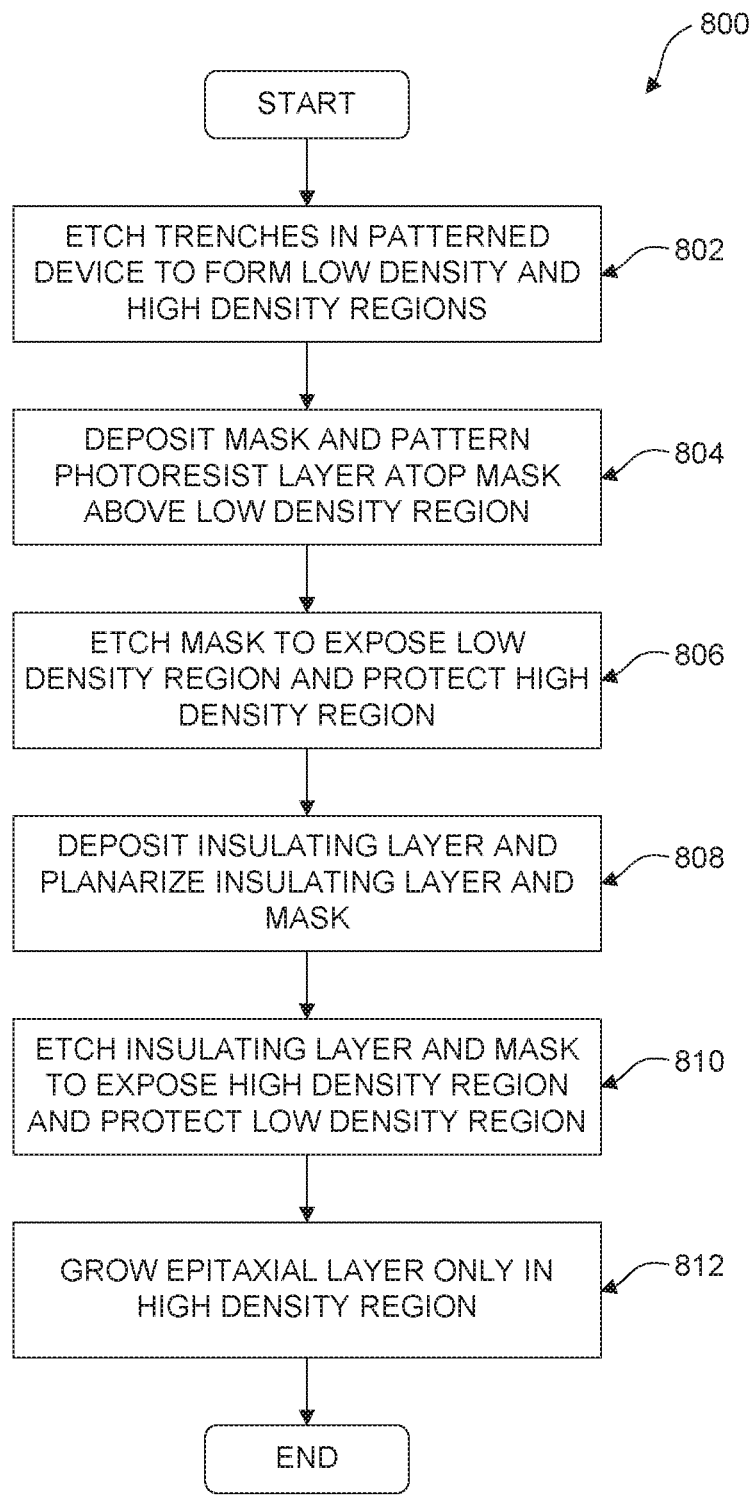
FIG. 8 illustrates a processing flow diagram to fabricate a patterned device with a reduced epitaxial growth loading effect, according to some embodiments.

FIG. 8 illustrates flow diagram 800 for reducing an epitaxial growth loading effect, accordingly to an exemplary embodiment. It is to be appreciated that not all steps in FIG. 8 may be needed to perform the disclosure provided herein. Further, some of the steps may be performed simultaneously, or in a different order than shown in FIG. 8. Flow diagram 800 shall be described with reference to FIG. 8. However, flow diagram 800 is not limited to those example embodiments.

In step 802, as shown in the example of FIG. 1, first trench 112 and second trench 114 are formed or etched in patterned device 100 to form low pattern density region 108 and high pattern density region 110. Low pattern density region 108 includes first trench 112. High pattern density region 110 includes second trench 114. First trench 112 has a larger cross-sectional area than second trench 114. First trench 112 and second trench 114 extend through insulating layer 125 and partially through substrate 102. As shown in FIG. 1, patterned device 100 can additionally include first top insulating layer 126 and second top insulating layer 128. First top insulating layer 126 is disposed over insulating layer 125, and second top insulating layer 128 is disposed over first top insulating layer 126. In some embodiments, low pattern density region 108 can include a plurality of first trenches 112. In some embodiments, high pattern density region 110 can include a plurality of second trenches 114. In some embodiments, first trench 112 and second trench 114 can be formed by etching. For example, first trench 112 and second trench 114 can be formed by anisotropic reactive ion etching (ME). In some embodiments, the etching of insulating layer 125, alternating insulating layer 120, first bottom insulating layer 104, second bottom insulating layer 106, first top insulating layer 126, and/or second top insulating layer 128 can be performed in one etching process or different etching processes. For example, the etching processes can be plasma processes, for example, RIE using oxygen-based plasma. In some embodiments, ME process can include etchant gas, for example, carbon tetrafluoride ($CF_4$), sulfur hexafluoride ($SF_6$), fluoroform ($CHF_3$), and/or other suitable gases. Numerous other etching methods can also be suitable. In some embodiments, first trench 112 and second trench 114 can be formed by using a mask, for example, a photoresist mask that can be patterned, and etching portions insulating layer 125, alternating insulating layer 120, first bottom insulating layer 104, second bottom insulating layer 106, first top insulating layer 126, and/or second top insulating layer 128 exposed by the patterned mask using a suitable etching process, e.g., dry etch and/or wet etch. In some embodiments, first trench 112 and second trench 114 can be through insulating layer 125, alternating insulating layer 120, first bottom insulating layer 104, second bottom insulating layer 106, first top insulating layer 126, and/or second top insulating layer 128 and substantially into substrate 102. The mask can be removed after first trench 112 and second trench 114 are formed.

In step 804, as shown in the example of FIG. 2, protective mask 130 is deposited or formed over all or some portion of insulating layer 125, first top insulating layer 126, or second top insulating layer 128, and photoresist mask 138 is deposited or formed over all or some portion of protective mask 130, and is patterned to isolate or expose a particular region of interest (e.g., low pattern density region 108) of protective mask 130 for further processing. For example, a suitable photoresist (e.g., PMMA, SU-8, SPR3612, AZ4620, etc.) can be spun onto protective mask 130 to form a photoresist layer, which can subsequently be patterned by exposure to absorptive light (e.g., DUV, I-line, H-line, etc.) and development with an appropriate developer to form photoresist mask 138. Other photoresist techniques or procedures can be used as known in the art. In some embodiments, protective mask 130 can include one or more layers. For example, as shown in FIG. 2, protective mask 130 can include first dielectric layer 132, second dielectric layer 134, and/or third dielectric layer 136. In some embodiments, first dielectric layer 132 can be silicon oxide. In some embodiments, first dielectric layer 132 can be fast deposited or deposited rapidly so as not to coat first trench 112 and/or second trench 114. For example, first dielectric layer 132 can be deposited by rapid thermal CVD (RTCVD). In some embodiments, first dielectric layer 132, second dielectric layer 134, and/or third dielectric layer 136 can be can be any suitable dielectric material including silicon oxide, silicon nitride, silicon oxynitride, organosilicate glass, spin-on-glass (SOG), an anti-reflective coating, and/or any other suitable dielectric materials. In some embodiments, protective mask 130 can be formed or deposited by any suitable methods including CVD, PVD, PECVD, LPCVD, sputtering, MOCVD, ALD, PLD, liquid source misted chemical deposition, and/or other suitable deposition methods. In some embodiments, second dielectric layer 134 and/or third dielectric layer 136 can be omitted from protective mask 130. In some embodiments, protective mask 130 is first dielectric layer 132.

In step 806, as shown in the example of FIG. 3, protective mask 130 is etched to expose first trench 112 in low pattern density region 108, while second trench 114 in high pattern density region 110 is protected. Photoresist mask 138 can be removed either during etching of protective mask 130 or after by, for example, ashing, plasma etching, and/or by using a photoresist stripper. In some embodiments, multiple photoresist layers and/or multiple etching processes can be employed to etch protective mask 130. In some embodiments, protective mask 130 can be etched by anisotropic RIE. In some embodiments, the etching of protective mask 130 can be performed in one etching process or different etching processes. For example, the etching processes can be plasma processes such as, for example, RIE using oxygen-based plasma. In some embodiments, RIE process can include etchant gas such as, for example, $CF_4$, $SF_6$, $CHF_3$, and/or other suitable gases. Numerous other etching methods can also be suitable, for example, dry etch and/or wet etch processing as known in the art.

In step 808, as shown in the examples of FIGS. 4 and 5, protective layer 140 is deposited or formed over all or some portion of insulating layer 125, first top insulating layer 126, or second top insulating layer 128, and first trench 112, in order to partially or completely fill first trench 112, and protective layer 140 and protective mask 130 are subsequently planarized. In some embodiments, protective layer 140 can include one or more layers. In some embodiments, protective layer 140 can be silicon oxide. In some embodiments, first dielectric layer 132 and protective layer 140 can be the same material. In some embodiments, protective layer 140 can be any suitable dielectric material including silicon oxide, silicon nitride, silicon oxynitride, organosilicate glass, spin-on-glass (SOG), an anti-reflective coating, and/or any other suitable dielectric materials. In some embodiments, protective layer 140 can be formed or deposited by any suitable methods including CVD, PVD, PECVD, LPCVD, sputtering, MOCVD, ALD, PLD, liquid source misted chemical deposition, and/or other suitable deposition methods. In some embodiments, protective layer 140 can be deposited to fill or completely fill first trench 112. In some embodiments, protective layer 140 can be silicon oxide deposited by ALD. In some embodiments, protective layer 140 can be deposited to a vertical thickness equal to a top surface of insulating layer 125, first top insulating layer 126, second top insulating layer 128, first dielectric layer 132, second dielectric layer 134, or third dielectric layer 136 in low pattern density region 108. Protective layer 140 and protective mask 130 can be planarized or polished by, for example, chemical mechanical planarization (CMP) to form planarized surface 150. For example, as shown in FIG. 5, protective mask 130 can be planarized down to first dielectric layer 132, such that a top surface of protective layer 140 and a top surface of first dielectric layer 132 have equal vertical heights. In some embodiments, planarized surface 150 can be formed by one or more etching processes. For example, planarized surface 150 can be formed by anisotropic RIE, RIE using oxygen-based plasma, ME using an etchant gas, for example, $CF_4$, $SF_6$, $CHF_3$, and/or other suitable gases, dry etching, and/or wet etching as known in the art.

In step 810, as shown in the example of FIG. 6, protective layer 140 and protective mask 130 are etched, such that second trench 114 in high pattern density region 110 is exposed, while first trench 112 in low pattern density region 108 is protected by protective layer 140. For example, as shown in FIG. 6, protective layer 140 and first dielectric layer 132 are etched down to etched top surface 160. In some embodiments, protective layer 140 and first dielectric layer 132 can be the same material. For example, protective layer 140 and first dielectric layer 132 can be silicon oxide. In some embodiments, etched top surface 160 can be formed by one or more etching processes. For example, etched top surface 160 can be formed by anisotropic ME, RIE using oxygen-based plasma, ME using an etchant gas, for example, $CF_4$, $SF_6$, $CHF_3$, and/or other suitable gases, dry etching, and/or wet etching as known in the art. In some embodiments, protective layer 140 and first dielectric layer 132 can be wet etched. For example, buffered oxide etch (BOE) or buffered hydrofluoric acid (BHF) can be used.

In step 812, as shown in the example of FIG. 7, high density epitaxial layer 118 is grown in second trench 114 in high pattern density region 110 by epitaxy. An epitaxial growth loading effect between low pattern density region 108 and high pattern density region 110 is reduced since protective layer 140 functions as a second insulating layer for first trench 112 during epitaxy. Current leakage in patterned device 700 is reduced since protective layer 140 in first trench 112 encourages uniform epitaxial growth of high density epitaxial layer 118 in second trench 114 of high pattern density region 110. In some embodiments, high density epitaxial layer 118 can be an epitaxial grown semiconductor layer. For example, high density epitaxial layer 118 can be epitaxial silicon, silicon germanium, germanium, III-V compound material, II-VI compound material, organic semiconductor material, and/or other suitable semiconductor materials. In some embodiments, high density epitaxial layer 118 can be single-crystalline.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A patterned device, comprising:
   a substrate;
   a first insulating layer over the substrate;
   a low pattern density region comprising a first trench in the first insulating layer and the substrate;
   a high pattern density region comprising a second trench in the first insulating layer and the substrate;
   a second insulating layer formed in the first trench; and
   an epitaxial grown layer formed in the second trench,
   wherein the first trench has a larger cross-sectional area than the second trench,
   wherein the first trench extends through the first insulating layer to the substrate,
   wherein the second insulating layer contacts the substrate, and
   wherein a top end of the second trench, opposite the substrate, remains exposed.

2. The patterned device of claim 1, wherein the first insulating layer comprises alternating silicon oxide and silicon nitride layers.

3. The patterned device of claim 1, wherein the patterned device comprises a three-dimensional NAND memory device.

4. The patterned device of claim 1, wherein the second insulating layer is silicon oxide.

5. The patterned device of claim 4, wherein the second insulating layer is atomic layer deposited silicon oxide.

6. The patterned device of claim 1, wherein the second insulating layer completely fills the first trench of the low pattern density region.

7. The patterned device of claim 1, wherein the second insulating layer fills the first trench and reduces an epitaxial growth loading effect between the low pattern density region and the high pattern density region.

* * * * *